United States Patent [19]

Duerr

[11] Patent Number: 5,602,557
[45] Date of Patent: Feb. 11, 1997

[54] MAMMOGRAPHY ANTENNA ARRANGEMENT FOR NMR EXAMINATIONS OF A FEMALE BREAST

[75] Inventor: Wilhelm Duerr, Erlangen, Germany

[73] Assignee: Siemens Aktiengesellschaft, Munich, Germany

[21] Appl. No.: 534,882

[22] Filed: Sep. 27, 1995

[30] Foreign Application Priority Data

Sep. 29, 1994 [DE] Germany ........................ 44 34 948.3

[51] Int. Cl.$^6$ .................................................. G01R 33/08
[52] U.S. Cl. ........................ 343/742; 324/318; 128/653.5
[58] Field of Search ..................................... 343/742, 741, 343/866, 867; 324/318, 309, 322, 316, 311; 128/653.5, 653.1

[56] References Cited

U.S. PATENT DOCUMENTS

| 2,787,788 | 4/1957 | Clough | 343/742 |
|---|---|---|---|
| 4,467,282 | 8/1984 | Siebold | 324/309 |
| 4,785,303 | 11/1988 | Clark et al. | 343/742 |
| 5,258,766 | 11/1993 | Murdoch | 343/742 |

FOREIGN PATENT DOCUMENTS

| 495989 | 9/1953 | Canada | 343/742 |
|---|---|---|---|
| 0338624 | 10/1989 | European Pat. Off. . | |
| 0565178 | 10/1993 | European Pat. Off. . | |
| 2166000 | 4/1986 | United Kingdom | 343/742 |

*Primary Examiner*—Hoanganh T. Le
*Attorney, Agent, or Firm*—Hill, Steadman & Simpson

[57] ABSTRACT

A mammography antenna arrangement for magnetic resonance examinations of the female breast has first and second conductor loop pairs, each of which is formed by two saddle-shaped conductor loops lying opposite one another and between which an essentially cylindrical examination space, having a receptacle opening, is located. The two conductor loop pairs are rotationally offset by 90° relative to one another in the circumferential direction. A capacitive element is connected in a part of each conductor loop that faces away from the receptacle opening.

7 Claims, 1 Drawing Sheet

MAMMOGRAPHY ANTENNA ARRANGEMENT FOR NMR EXAMINATIONS OF A FEMALE BREAST

BACKGROUND OF THE INVENTION

1. Field of the Invention

The present invention is directed to an antenna arrangement suited for conducting a magnetic resonance examination of a female breast.

2. Description of the Prior Art

A mammography antenna arrangement for magnetic resonance examinations of a female breast is disclosed in German OS 31 31 946, corresponding to U.S. Pat. No. 4,467,282. This known arrangement has first and second conductor loop pairs. Each pair is formed by two saddle-shaped conductor loops lying opposite one another and between which an essentially cylindrical examination space is located. The two conductor loop pairs are rotationally offset by 90° relative to one another in a circumferential direction.

Magnetic resonance examinations with circularly polarized radio-frequency fields can be implemented with this antenna arrangement. That known arrangement has two conductor loop pairs offset by 90° relative to one another with respective antenna characteristics residing perpendicularly to one another in the inside of the examination space surrounded by the conductor loop pairs, which are arranged on a cylindrical carrier member. The longitudinal axis of the antenna arrangement is directed parallel to the static basic magnetic field, as a result of which the radio-frequency fields generated during transmission and the most sensitive reception regions are disposed perpendicularly relative to the basic magnetic field. The antenna arrangement is dimensioned as a whole-body antenna; an entire human body can be introduced into the examination space in the axial direction through an acceptance opening. Antenna arrangements that are shorter in the axial direction, however, are desirable for examining sub-areas of the human body. In this known antenna, however, a shortening of the effective antenna conductors degrades the imaging properties.

SUMMARY OF THE INVENTION

An object of the present invention is to provide a circularly polarizing antenna arrangement for magnetic resonance examinations of the female breast having good imaging properties.

This object is achieved in an antenna arrangement having a conductor structure conforming to that described above but having a capacitive element connected in a part of each conductor loop that faces away from a receptacle opening for the female breast. With the capacitive elements, the antenna arrangement can be tuned to the working frequency of the magnetic resonance apparatus, but the electrical high-frequency field arising in the proximity of each capacitive element is far enough away from human tissue so that losses due to electrical fields remain low. Further, systems for fixing the position of the breast and localization means for lesions or biopsy systems can be well-accommodated because of the relatively open design of the antenna system.

In one embodiment neighboring conductor loops overlap in the circumferential direction. The conductor loop pairs are mutually decoupled due to the overlap.

In a further embodiment the capacitive elements are connected into the middle of those parts of the conductor loops facing away from the receptacle opening.

In order to enhance the coupling and the symmetry between the conductor loops belonging to a conductor loop pair, the capacitive elements in another embodiment are electrically connected in parallel within the conductor loop pairs.

In an especially advantageous embodiment one of the conductor loops has a distended portion at its part facing toward the receptacle opening that enlarges the conductor loop laterally from the receptacle opening and is directed away from the examination space. An adequate sensitivity of, in particular, the field components in the radial direction can thus be achieved in the lymph discharge area of the breast in the region of the axilla, which is an area of particular medical interest.

The asymmetry caused by the distended portion, and thus a coupling in the antenna arrangement, could be compensated by different values of capacitance of the capacitive elements. According to another embodiment, the two conductor loop pairs are decoupled from one another by a further capacitive element that is connected into the middle of the distended portion.

DESCRIPTION OF THE PREFERRED EMBODIMENTS

Figure 1:
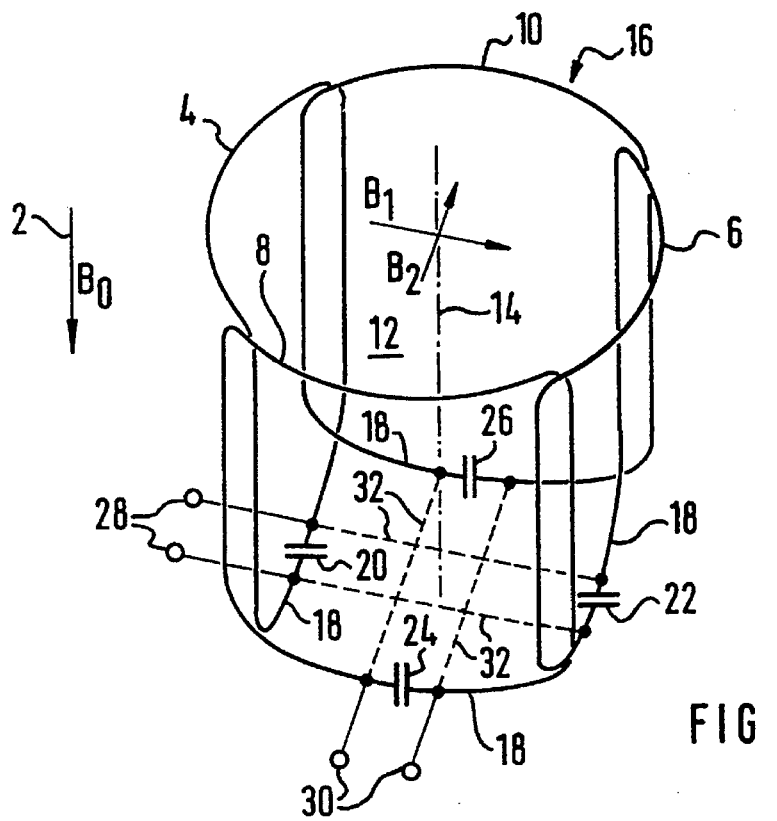
FIG. 1 illustrates a first embodiment of a mammography antenna arrangement constructed in accordance with the principles of the present invention.

The mammography antenna arrangement shown in FIG. 1 is provided for magnetic resonance examinations of the female breast. The examination is conducted with the patient in a prone position when the basic magnetic field $B_0$ is vertically aligned in the magnetic resonance apparatus that is employed. The vertical alignment is symbolized by an arrow 2. The mammography antenna arrangement has four saddle-shaped conductor loops 4, 6, 8, and 10. Neighboring conductor loops overlap for decoupling from one another. Two conductor loops 4 and 6 form a first conductor loop pair, disposed directly opposite a second conductor loop pair formed by conductor loops. The two conductor loop pairs are rotationally offset by 90° relative to one another in the circumferential direction. A cylindrical examination space 12 is located between the conductor loops 4, 6, 8 and 10. The antenna arrangement is oriented in the magnetic resonance apparatus such that the axis 14 of the examination space 12 proceeds parallel to the direction of the basic magnetic field $B_0$. Given a vertical basic magnetic field, an end face of the examination space 12 lies in a horizontal plane and is fashioned as a receptacle opening 16 for providing access for a female beast into the examination space 12. Respective capacitive elements 23, 22, 24 and 26 are connected in the conductor loops 4, 6, 8 and 10 in a part 18 facing away from the receptacle opening 16, namely in the middle thereof. As a result, the antenna arrangement is tuned to the operating frequency of the magnetic resonance apparatus. Given the symmetry of the conductor loops 4, 6, 8 and 10 that is present, the capacitance values of the capacitive elements 20, 22, 24 and 26 are all the same.

Electrical terminals 28 and 30 for feeding or tapping the antenna signals are connected in parallel with each capacitive element 20, 22, 24 and 26. As an example for the transmission mode, the directions of radio-frequency fields $B_1$ and $B_2$ are shown, these residing perpendicularly to one another in the examination space and being additionally aligned perpendicularly to the basic magnetic field $B_0$.

The antenna arrangement is suitable both for circularly polarizing operation and for array operation. Given array operation, the conductor loops 4, 6, 8 and 10 can be activated independently of one another.

Given circularly polarizing operation, a better coupling of the conductor loops 4 and 6 or 8 and 10 belonging to a conductor loop pair, as well as a more uniform field distribution, are by electrically connecting achieved in that the capacitive elements 20 and 22 or 24 and 26, respectively belonging to the pairs to one another. This is indicated by a broken line 32.

Figure 2:
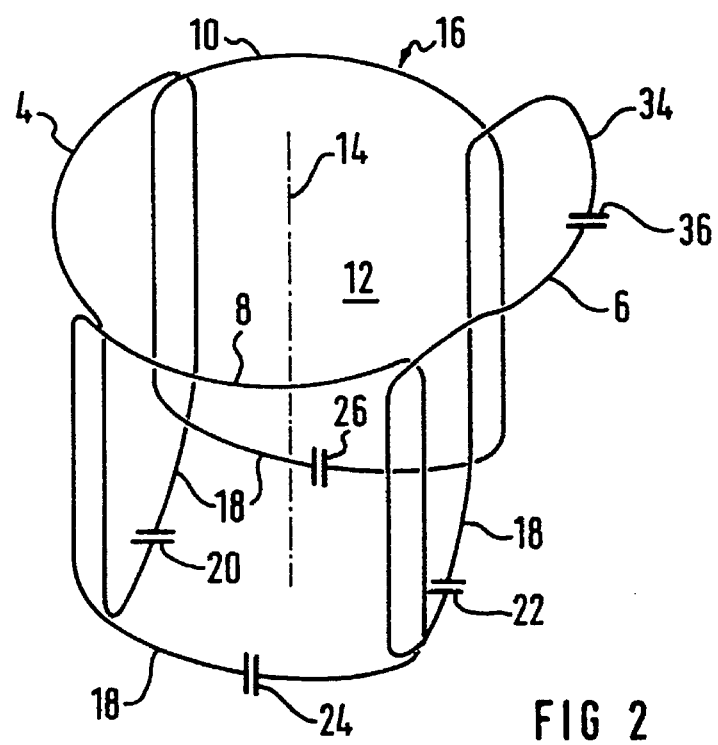
FIG. 2 illustrates a second embodiment of a mammography antenna arrangement constructed in accordance with the principles of the present invention, wherein enhanced sensitivity is established in the axillary region.

The mammography antenna arrangement of FIG. 2 differs from the arrangement of FIG. 1 essentially on the basis of a the embodiment of FIG. 2 having a distended portion 34 in one of the conductor loops. Here, the conductor loop 6 is enlarged by the distended portion 34 extending laterally from the receptacle opening 16 and directed away from the examination space 12. A high sensitivity of the antenna arrangement for a horizontal field component above the receptacle opening 16 can thus be achieved, as a result of which the diagnostically interesting lymph discharge region of the breast in the area of the axilla is also accessible for a magnetic resonance examination. The asymmetry in the antenna arrangement caused by the distended portion 34 can be compensated by a further capacitative element 36 arranged in the middle of the distended portion 34.

Although modifications and changes may be suggested by those skilled in the art, it is the intention of the inventor to embody within the patent warranted hereon all changes and modifications as reasonably and properly come within the scope of his contribution to the art.

I claim as my invention:

1. A mammography antenna arrangement for magnetic resonance examination of a female breast, said antenna arrangement comprising:

first and second saddle-shaped conductor loops disposed opposite each other and forming a first conductor loop pair;

third and fourth saddle-shaped conductor loops disposed opposite each other and forming a second conductor loop pair;

said first and second conductor loop pairs being disposed relative to each other rotationally offset by approximately 90° in a circumferential direction and forming a substantially cylindrical examination space having an upper receptacle opening adapted for receiving a female breast, and each of said first, second, third and fourth saddle-shaped conductor loops having a conductor loop portion facing away from said receptacle opening; and a plurality of capacitive elements respectively disposed in said conductor loop portions of said first, second, third and fourth saddle-shaped conductor loops.

2. A mammography antenna arrangement as claimed in claim 1 wherein said first and second conductor loop pairs are disposed with adjacent saddle-shaped conductor loops overlapping in said circumferential direction.

3. A mammography antenna arrangement as claimed in claim 1 wherein the conductor loop portion of each saddle-shaped conductor loop comprises a middle portion of that saddle-shaped conductor loop.

4. A mammography antenna arrangement as claimed in claim 3 wherein the respective capacitive elements in said first and second saddle-shaped conductor loops are connected in parallel, and wherein the respective capacitive elements in said third and fourth saddle-shaped conductor loops are connected in parallel.

5. A mammography antenna arrangement as claimed in claim 1 wherein one of said saddle-shaped conductor loops comprises a distended portion at a region thereof facing toward said receptacle opening, said distended portion enlarging said one of said saddle-shaped conductor loops laterally from said receptacle opening and away from said examination space.

6. A mammography antenna arrangement as claimed in claim 5 wherein said distended portion is symmetrical relative to said one of said saddle-shaped conductor loops.

7. A mammography antenna arrangement as claimed in claim 5 further comprising a further capacitive element connected in a middle of said distended portion.

* * * * *